(12) United States Patent
Kamikawa et al.

(10) Patent No.: US 7,595,549 B2
(45) Date of Patent: Sep. 29, 2009

(54) SURFACE MOUNT SEMICONDUCTOR DEVICE

(75) Inventors: Toshimi Kamikawa, Tokyo (JP); Hayato Oba, Tokyo (JP); Shinichi Miyamura, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/275,643

(22) Filed: Jan. 20, 2006

(65) Prior Publication Data

US 2006/0163705 A1 Jul. 27, 2006

(30) Foreign Application Priority Data

Jan. 21, 2005  (JP)  .............................. 2005-014204

(51) Int. Cl.
*H01L 23/495* (2006.01)
(52) U.S. Cl. .............................. 257/676; 257/E23.031; 257/E23.047; 257/E23.066; 257/E33.058; 257/E33.059; 257/E33.066; 257/776; 257/775; 257/774; 257/773; 257/680; 257/728; 257/99; 257/98; 257/13; 361/301.3
(58) Field of Classification Search ................ 257/676, 257/E23.031, E23.047, E23.066, 776, 775, 257/774, 773, 680, 728, 99, 98, 13, E33.058, 257/E33.059, E33.066; 361/301.3
See application file for complete search history.

(56) References Cited

U.S. PATENT DOCUMENTS

| | | | |
|---|---|---|---|
| 5,040,868 A | | 8/1991 | Waitl et al. |
| 5,905,301 A | * | 5/1999 | Ichikawa et al. ............ 257/676 |
| 6,396,131 B1 | * | 5/2002 | Kinsman et al. ............ 257/669 |
| 6,486,543 B1 | * | 11/2002 | Sano et al. .................. 257/684 |
| 6,635,954 B2 | * | 10/2003 | Kinsman et al. ............ 257/669 |
| 6,940,704 B2 | * | 9/2005 | Stalions ..................... 361/241 |
| 7,005,325 B2 | * | 2/2006 | Chow et al. ................. 438/123 |
| 7,230,280 B2 | * | 6/2007 | Yaw et al. .................... 257/98 |

(Continued)

FOREIGN PATENT DOCUMENTS

DE  10102119  4/2002

(Continued)

OTHER PUBLICATIONS

European Search Report for EP Patent App. No. 06000841.4 (Mar. 4, 2008).

*Primary Examiner*—Alexander O Williams
(74) *Attorney, Agent, or Firm*—Cermak Kenealy Vaidya & Nakajima LLP

(57) ABSTRACT

A surface mount semiconductor device using a lead frame can suppress stress applied to a package by a load in a forming process performed for the lead frame projecting from the package at a portion at which the lead frame projects the package. Concave portions can be provided in at least one lead of a pair of leads that project laterally from side faces of the package. The concave portions can be arranged at positions where the leads are bent approximately perpendicularly along the side faces of the package at respective central portions of the leads. Thus, a cross-sectional area of a bending portion of the lead can be reduced, thereby enabling the lead (or leads) to be easily bent with a smaller bending load. Therefore, a surface mount semiconductor device can be achieved which prevents disconnection without impairing a heat radiation property and which has good moisture resistance.

17 Claims, 4 Drawing Sheets

U.S. PATENT DOCUMENTS

| | | | |
|---|---|---|---|
| 7,282,785 B2 * | 10/2007 | Yoshida | 257/666 |
| 7,317,181 B2 * | 1/2008 | Murakami et al. | 250/214.1 |
| 2002/0097579 A1 * | 7/2002 | Stalions | 362/241 |
| 2002/0185650 A1 * | 12/2002 | Hasegawa | 257/81 |
| 2003/0168720 A1 * | 9/2003 | Kamada | 257/666 |
| 2004/0075100 A1 * | 4/2004 | Bogner et al. | 257/99 |
| 2005/0162808 A1 * | 7/2005 | Nakai | 361/301.3 |
| 2005/0236639 A1 * | 10/2005 | Abe et al. | 257/100 |
| 2006/0001055 A1 * | 1/2006 | Ueno et al. | 257/257 |
| 2006/0017143 A1 * | 1/2006 | Shimanuki et al. | 257/678 |
| 2006/0102918 A1 * | 5/2006 | Su et al. | 257/99 |
| 2006/0226435 A1 * | 10/2006 | Mok et al. | 257/98 |
| 2007/0012940 A1 * | 1/2007 | Suh et al. | 257/99 |

FOREIGN PATENT DOCUMENTS

| | | |
|---|---|---|
| EP | 1022787 | 7/2000 |
| JP | 58215061 | 12/1983 |
| JP | 08008375 | 1/1996 |
| JP | 2003007946 | 1/2003 |

* cited by examiner

SURFACE MOUNT SEMICONDUCTOR DEVICE

This application claims the priority benefit under 35 U.S.C. §119 of Japanese Patent Application No. 2005-014204 filed on Jan. 21, 2005, which is hereby incorporated in its entirety by reference.

BACKGROUND OF THE INVENTION

1. Field of the Invention

The invention relates to a surface mount semiconductor device. More particularly, embodiments of the invention relate to surface mount semiconductor devices using a package formed by insert-molding a lead frame with a resin.

2. Description of the Related Art

Various structures for a surface mount semiconductor device are known. For example, Japanese Patent Laid-Open Publication No. 2003-007946 describes the following structure as a conventional technique. A lead frame for multiple devices is manufactured by pressing and stamping a metal board. The lead frame is then insert-molded with a resin so as to form a plurality of packages for surface mount semiconductor devices. Each package has a concave portion at its center. Then, a semiconductor chip is mounted on the lead frame that is exposed at a bottom of the concave portion of each package, and is sealed with a resin. Finally, the lead frame projecting laterally from a side face of each package is bent (e.g., using a forming process) so as to extend around the package toward a rear surface of the package via the side face.

FIG. 1 shows a part of the lead frame for multiple devices, which is used in the aforementioned surface mount semiconductor device. The shown part corresponds to one surface mount semiconductor device. The lead frame 100 includes a lead portion 101 on which a semiconductor chip is to be mounted (die-bonded) and a lead portion 102 to which one end of a bonding wire connected to the semiconductor chip at the other end thereof is connected (wire-bonded). The two lead portions 101 and 102 are separated from each other.

A package 103 is formed by insert molding with a resin on a die bonding pad 108 and a wire bonding pad 109 that are parts of the lead frame 100 at which die bonding and wire bonding are achieved, respectively. The lead portions 101 and 102 projecting laterally from a pair of opposed side faces 104 and 105 of the package 103 are bent along the side faces 104 and 105 and a rear face (not shown) of the package 103.

Elongate through holes 106 and 107 are provided at centers of the lead portions 101 and 102, respectively. Each of the elongate through holes 106 and 107 has an approximately rectangular shape that is approximately perpendicular to a projecting direction of the corresponding lead portion 101 or 102 from the side face of the package 103 when the package 103 is formed. The lead portions 101 and 102 projecting from the package 103 can be bent approximately perpendicularly along the side faces 104 and 105 of the package 103 at positions of the elongate through holes 106 and 107, respectively. The reason for providing the elongate through holes 106 and 107 is that the elongate through holes 106 and 107 can reduce cross-sectional areas of bending portions of the lead portions 101 and 102, respectively, thereby enabling the forming process to be easily performed with a smaller load, as compared with a case in which the elongate through holes 106 and 107 are not provided.

Accordingly, it is possible to suppress stress that is applied to the package 103 near positions from which the lead portions 101 and 102 project in the forming process performed for the lead portions 101 and 102, when the package 103 is formed. It is also possible to prevent occurrence of troubles such as degradation of adhesiveness between the package 103 and the lead portions 101 and 102 and breakage of the package 103, caused by a heat generated in soldering in a mounting process, heat generated from the semiconductor chip that is operating, or the like. Therefore, it is possible to prevent the electrical properties of the device from becoming poor because of poor moisture resistance caused by the above troubles.

As the length of the elongate through holes 106 and 107 becomes closer to the width of the lead portions 101 and 102, the cross-sectional areas of the bending portions of the lead portions 101 and 102 are reduced. Therefore, the lead portions 101 and 102 can be easily bent with a smaller load.

However, the above reduction of the cross-sectional area makes a thermal resistance of each lead portion 101 or 102 larger. Therefore, a property for radiating the heat generated from the semiconductor chip is degraded, thus degrading the properties of the semiconductor chip. Moreover, the lead portions 101 and 102 may be broken by vibration or impact after mounting. In this case, the semiconductor device is inoperative. In addition, the elongate through holes 106 and 107 are partially located in the package 103. Thus, when the elongate through holes 106 and 107 become larger, moisture absorption into the package 103 may proceed so as to make the properties of the semiconductor chip poor.

SUMMARY OF THE INVENTION

The invention was made in view of the aforementioned and other problems in the above-referenced and other art. In accordance with an aspect of the invention, a surface mount semiconductor device can include a lead frame, in which, assuming that a lead portion projecting from a package formed by insert-molding the lead frame with a resin is bent approximately perpendicularly along a side face of the package, the cross-sectional area of the lead at a center of a bending portion of the lead is reduced in advance. In accordance with another aspect of the semiconductor device, the device can prevent disconnection and ensure moisture resistance without impairing a heat radiation property.

In accordance with another aspect of the invention, a surface mount semiconductor device can include a lead frame that is insert-molded to a package that is formed of a resin and has a concave portion. The concave portion can be filled with a transparent resin to seal a semiconductor chip mounted at a bottom of the concave portion with the transparent resin. A pair of leads projecting laterally from side faces of the package that are opposed to each other are bent approximately perpendicularly along the side faces of the package at portions at which the leads project from the package. In this configuration, the surface mount semiconductor device can further include means for reducing a cross-sectional area of each of the leads that is partially provided at a center of the bending portion of the lead.

In the surface mount semiconductor device of the above configuration, the means for reducing the cross-sectional area of each of the leads may be formed by a concave elongate groove that does not penetrate through that lead in a thickness direction, is formed on at least one surface of the lead, and has an approximately V-shaped or U-shaped cross section when the bending portion of the lead is cut perpendicularly to the side face of the package from which the lead projects.

In the surface mount semiconductor device of the above configuration, the means for reducing the cross-sectional area of each of the leads may be formed by a plurality of concave grooves that do not penetrate through that lead in a thickness direction and are formed on at least one surface of the lead, each of the concave grooves having an approximately V-shaped or U-shaped cross section when the bending portion of the lead is cut parallel to the side face of the package from which that lead projects.

Similarly, the semiconductor device can also include means for reducing the force required to bend the lead that can take the form of the various grooves and reductions in cross-sectional thicknesses shown in FIGS. 2-9 and described in the present specification.

Another aspect of the invention is a surface mount semi-conductor device that includes: a lead frame; a package that is formed of a resin and has a concave portion, the lead frame being insert-molded to the package; a semiconductor element mounted at the concave portion and electrically connected with the lead frame; and a resin sealing portion which seals the semiconductor element with a transparent resin. In this configuration, the lead frame may have a pair of leads extending laterally from side faces of the package that are opposed to each other, the leads bent along the side faces of the package. Furthermore, a portion of the lead which is bent may be reduced in cross-sectional thickness.

In the surface mount semiconductor device described above, the portion of the lead that is bent may be reduced in cross sectional thickness at a partial central area.

In the surface mount semiconductor device described above, the portion of the lead that is bent may be provided with at least one groove that is reduced in cross-sectional thickness.

In the surface mount semiconductor device described above, a cross-sectional shape of the groove may be substantially V-shaped or substantially U-shaped, such as corner shaped, square shaped, rectangular shaped, circular shaped, oval shaped, etc., as well as other similar shapes.

In the surface mount semiconductor device described above, the groove may be provided in a direction substantially perpendicular to a direction in which the lead extends.

In the surface mount semiconductor device described above, the groove may be provided substantially parallel to a direction in which the lead extends.

In the surface mount semiconductor device described above, the groove may include an elongate groove which is provided in a direction substantially perpendicular to a direction in which the lead extends and which is shorter than a width of the lead.

In the surface mount semiconductor device described above, the groove may include a plurality of short grooves which are provided substantially parallel to a direction in which the lead extends, to reduce a cross-sectional thickness of the lead.

According to one embodiment of the invention, a package can be formed by insert-molding a lead frame with a resin. A pair of leads projecting laterally from side faces of the package that are opposed to each other can be bent approximately perpendicularly along the side faces of the package at portions at which the leads project from the package. The cross-sectional area of each lead is partially reduced at a center of the bending portion of that lead.

Thus, the above-described embodiment can have at least the following characteristics; it is possible to suppress stress applied to the package near the bending portions of the respective leads when the leads are bent; it is also possible to prevent occurrence of troubles such as degradation of adhesiveness between the package and the leads and breakage of the package caused by one ore more of either heat generated in soldering in a mounting process, heat generated from an operating semiconductor chip, or the like. Therefore, it is possible to prevent electrical properties from becoming poor because of poor moisture resistance caused by the above troubles.

BRIEF DESCRIPTION OF THE DRAWINGS

These and other features, advantages, and/or characteristics of the invention will become clear from the following description with reference to the accompanying drawings, wherein.

DETAILED DESCRIPTION OF PREFERRED EMBODIMENTS

Figure 1:
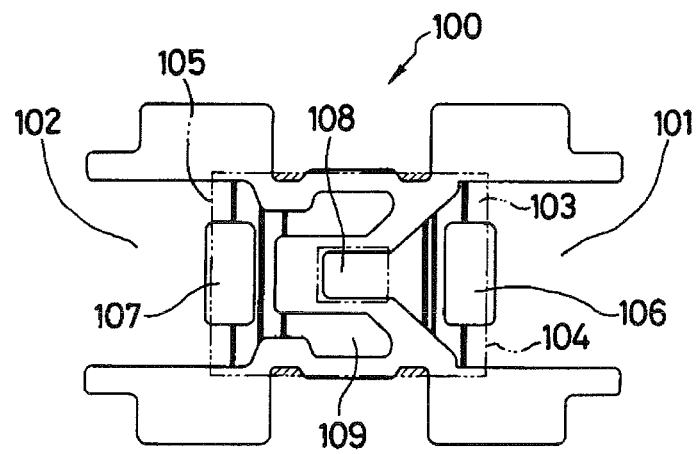
FIG. 1 is a plan view of a lead frame used in a conventional surface mount semiconductor device.

Exemplary embodiments of the invention will now be described in detail, with reference to FIGS. 2 to 9 (the same or similar components are labeled with the same reference numerals). The exemplary embodiments described below have various features that have certain technical characteristics and/or advantages. However, the scope of the invention should not be considered to be limited by the exemplary embodiments.

Figure 2:
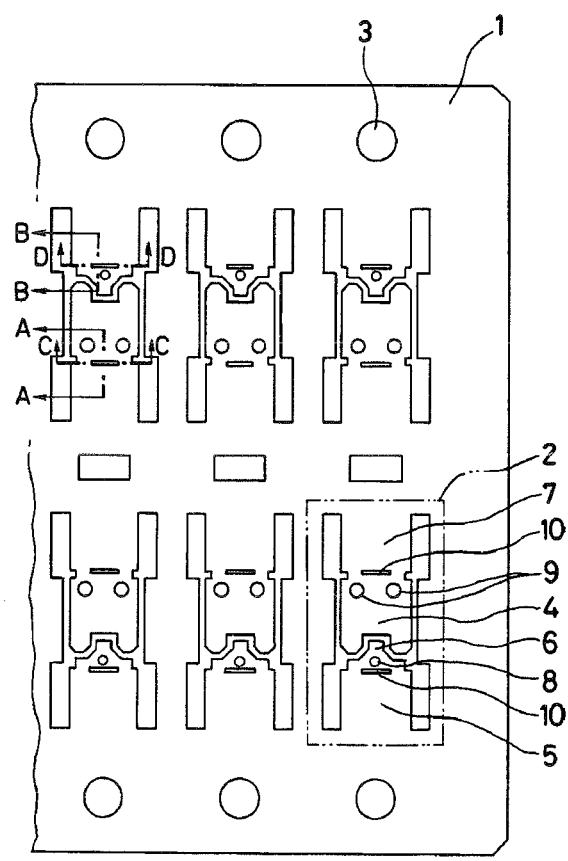
FIG. 2 is a plan view of a lead frame used in an exemplary embodiment of a surface mount semiconductor device that is made in accordance with principles of the invention.

FIG. 2 shows a lead frame 1 for multiple devices, which can be used for a surface mount semiconductor device according to this exemplary embodiment. For example, the lead frame 1 can be formed by pressing and stamping or etching a metal plate to remove an unnecessary portion of the metal plate. Here, the metal plate can be formed by a Cu alloy plate plated with Ni, Pd, Au, Ag, or the like.

A plurality of the same (or different) lead patterns 2 that are independent of each other can be arranged in one line at predetermined intervals in the lead frame 1 for multiple devices. Each of the lead patterns 2 can be used to form an individual surface mount semiconductor device. Alternatively, there may be two lines of lead patterns 2 in the lead frame 1. A plurality of feed holes 3 can be provided at both ends of the lead frame 1 along a longitudinal direction of the lead frame 1 so as to be arranged at predetermined intervals on straight lines parallel to each other.

The lead pattern 2 can include a pair of leads that are separated from each other. One lead 5 can have a die bonding pad 4 to which a semiconductor chip is die-bonded. The other lead 7 can have a wire bonding pad 6 connected to one end of a bonding wire that is connected at its other end to an upper electrode of the die-bonded semiconductor chip.

One through hole 8 may be provided in the lead 5 and two through holes 9 may be provided in the lead 7. A package that is formed by insert-molding the lead frame 1 with a resin so as to cover the leads 5 and 7 can be connected from both sides of the leads via the through holes 8 and 9 located in the leads 5 and 7, so that the leads 5 and 7 and the package covering those leads 5 and 7 is fixed and integrated as one unit.

Moreover, a concave portion 10 can be provided in each of the leads 5 and 7. The concave portion(s) 10 can be arranged outside the through hole 8 or the through holes 9 at a central portion of each lead 5 or 7. The position of the concave portion(s) 10 can correspond to a base of the package formed by insert molding with a resin. The concave portion(s) 10 can be located adjacent the bending portions at which the leads 5 and 7 which project laterally from side faces of the package are bent approximately perpendicularly along the side faces of the package in a forming process. The concave portion(s) 10 make it possible to reduce cross-sectional areas of the bending portions of the leads 5 and 7, thereby enabling the leads 5 and 7 to be easily bent with a smaller load.

The concave portion(s) 10 formed in each of the leads 5 and 7 can have various structures. For example, the concave portion(s) 10 can be formed to extend substantially parallel to the side faces of the package from which the leads 5 and 7 project and in such a manner that the concave portions 10 do not penetrate through the leads 5 and 7, respectively. Moreover, no concave portion is formed on at least a part of a straight line on which the concave portion 10 is provided, so that the thickness of the lead 5 or 7 can be maintained at that part without change.

Figure 3:
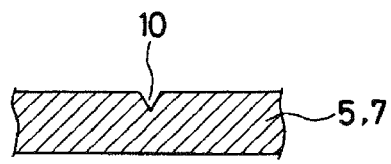
FIG. 3 is a cross-section view taken along either line A-A or line B-B in FIG. 2.
Figure 4:
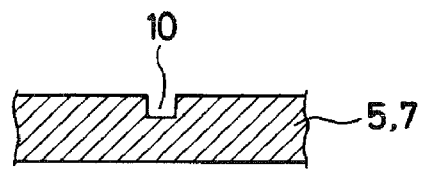
FIG. 4 is a cross-section view of another embodiment taken along a line similar to lines A-A and B-B of FIG. 2.
Figure 5:
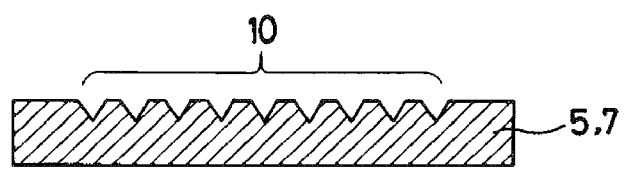
FIG. 5 is a cross-section view of another embodiment taken along a line similar to either the line C-C or the line D-D in FIG. 2.
Figure 6:
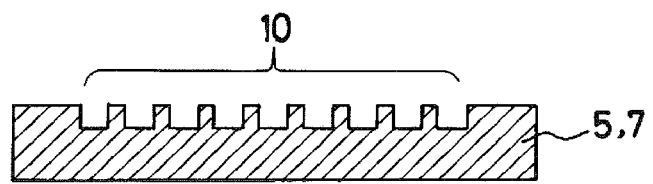
FIG. 6 is a cross-section view of another embodiment taken along a line similar to either the line C-C or the line D-D in FIG. 2.

Some exemplary shapes of the concave portion 10 are shown in FIGS. 3 to 6. FIG. 3 shows a cross section taken along line A-A (which can be the same as the cross-section along line B-B) in FIG. 2 and shows an exemplary shape of the concave portion 10. FIG. 4 shows another exemplary cross-sectional shape of the concave portion 10 taken from the same perspective as FIG. 3, but of another embodiment. FIG. 5 shows a cross section taken along a line similar to line C-C (which can be the same as the cross-section along line D-D) of another embodiment and shows another exemplary shape of the concave portion 10. FIG. 6 shows another exemplary cross-sectional shape of the concave portion 10 taken from the same perspective as in FIG. 5, but of another embodiment.

The exemplary shape of the concave portion 10 of FIG. 3 is formed by an elongate groove having an approximately V-shaped cross section when the concave portion 10 is cut along the direction in which the lead extends. The exemplary shape of the concave portion 10 shown in FIG. 4 is formed by an elongate groove having an approximately U-shaped cross section when the concave portion 10 is cut along the direction in which the lead extends. The exemplary shape of the concave portion 10 shown in FIG. 5 is formed by a plurality of approximately V-shaped independent grooves that are arranged on an approximately straight line, as viewed when the concave portion 10 is cut along the direction perpendicular to the direction in which the lead extends (the widthwise direction of the lead). The exemplary shape of the concave portion 10 shown in FIG. 6 is formed by a plurality of approximately U-shaped independent grooves that are arranged on an approximately straight line, as viewed when the concave portion 10 is cut along the direction perpendicular to the direction in which the lead extends.

It is desirable that a depth of the groove having the approximately V-shaped cross section and that of the groove having the approximately U-shaped cross section be within a range from $1/5$ to $2/3$ of the thickness of the lead frame. However, other thicknesses for the groove can be used in the lead frame.

In any of the above exemplary shapes of the concave portion, the cross-sectional area of the lead at the concave portion can be smaller than that of any other portion of the lead where no concave portion is provided. Therefore, when the lead is bent at the concave portion, it is possible to easily bend the lead with a smaller load. In addition, a plurality of grooves as shown in either of FIG. 3 or 4 can be used in the lead to form the concave portion. Likewise, a single one of the grooves as shown in FIG. 5 or 6 can be used to form the concave portion 10.

Figure 7:
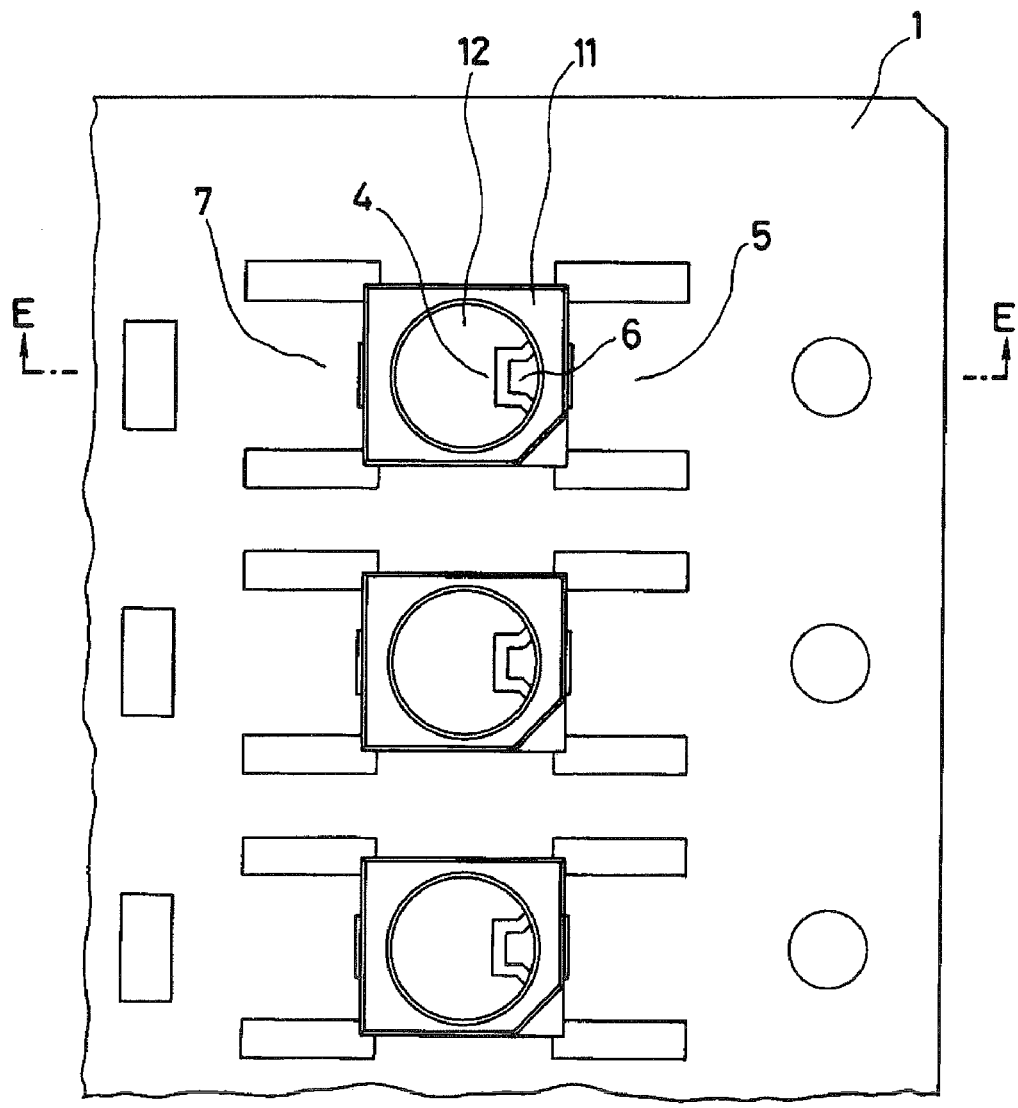
FIG. 7 is a plan view of the lead frame of FIG. 2 after the lead frame is insert-molded with a resin.
Figure 8:
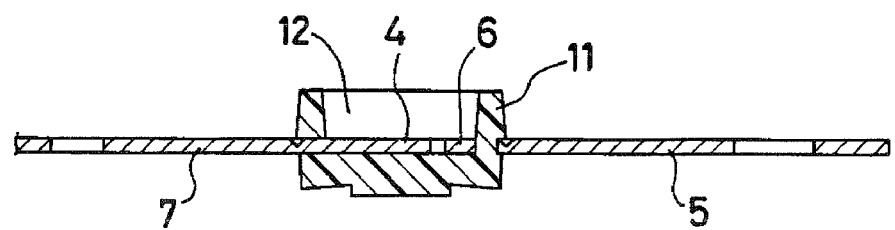
FIG. 8 is a cross-sectional view taken along line E-E in FIG. 7.

FIGS. 7 and 8 show a state in which a package 11 is formed by insert-molding the aforementioned lead frame 1 with a resin. FIG. 7 is a plan view and FIG. 8 shows a cross section taken along line E-E in FIG. 7. A concave portion 12 can be formed at a center of the package 11. The die bonding pad 4 and the wire bonding pad 6 of the leads 5 and 7 can be exposed at a bottom of the concave portion 12. The lead portions 5 and 7 laterally project from side faces of the package 11, respectively.

Figure 9:
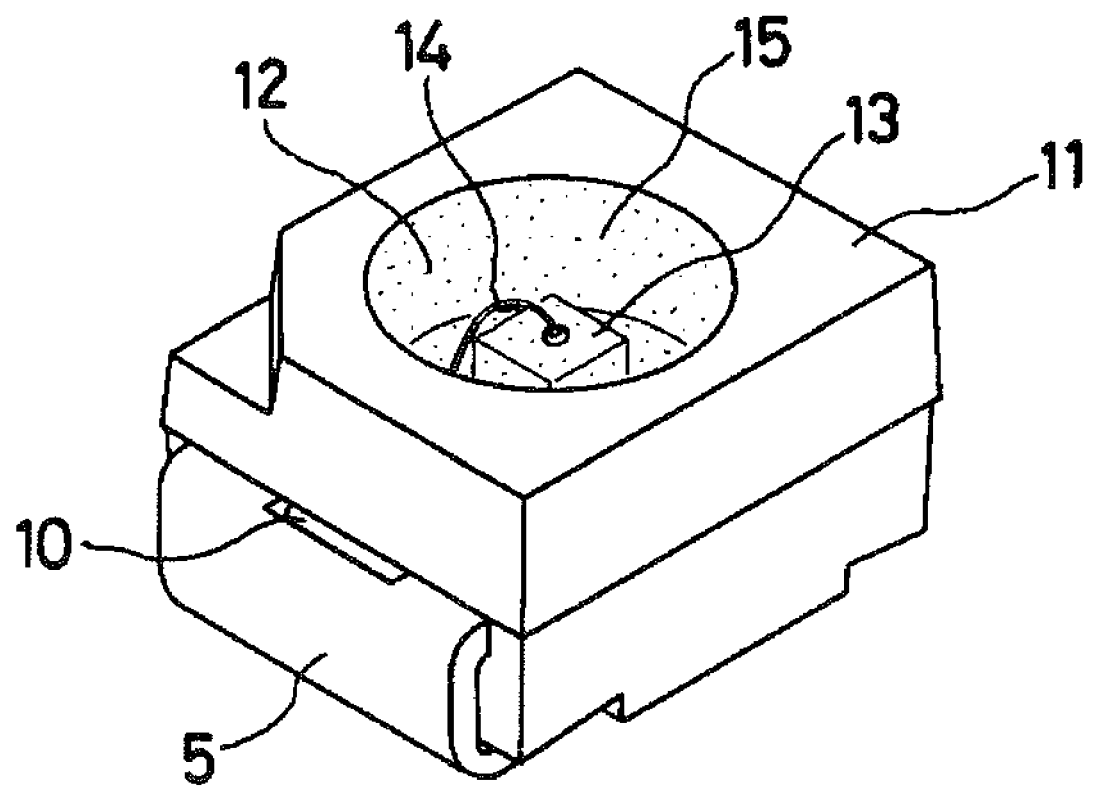
FIG. 9 is a perspective view showing an exemplary embodiment of a surface mount semiconductor device made in accordance with principles of the invention.

FIG. 9 shows a surface mount semiconductor device that can be completed in the following manner; the individual packages 11 are formed on the lead frame 1 for multiple devices; the die bonding pad and the wire bonding pad are exposed at the bottom of the concave portion 12 of each package 11 and a semiconductor chip 13 is die-bonded to each die-bonding pad and a bonding wire 14 is wire-bonded to each wire bonding pad; then, the concave portion 12 is filled with a transparent resin 15 to seal the semiconductor chip 13 and the bonding wire 14 with the transparent resin 15; the lead portions 5 and 7 projecting from the side faces of the package 11 are bent approximately perpendicularly along the side faces of the package 11 at the positions at which the leads 5 and 7 project from the package, and are further bent approximately perpendicularly along the bottom of the package; finally, the individual semiconductor devices are separated from each other.

As is apparent from FIG. 9, the cross-sectional area of each of the leads 5 and 7 projecting laterally from the side faces of the package 11 can be reduced by providing the concave portions 10 at the positions at which the leads project from the package 11 and at which they are bent approximately perpendicularly along the side face of the package 11. The portions 10 can be formed so as not to penetrate through the leads 5 and 7 in a thickness direction, respectively. Thus, it is possible to easily bend the leads 5 and 7 with a smaller bending load.

As a result, stress applied to the package near the position from which the leads project when the leads are bent can be suppressed. It is also possible to prevent occurrence of troubles such as degradation of adhesion between the package and the leads and breakage of the package, caused by heat generated during soldering in the mounting process, heat generated from the semiconductor chip during operation, or the like. Therefore, it is possible to prevent degradation of electrical properties due to poor moisture resistance caused by the above-described troubles.

Instead of providing a concave portion across the full width of each lead, the concave portion can be provided at the center of each lead while the thickness of that lead is maintained at a portion other than the concave portion. Thus, even if external stress such as vibration or impact is applied to the surface mount semiconductor device after the surface mount semiconductor device is mounted, disconnection can be prevented because of protection by the thicker portion of the lead, and the device's functionality can be maintained.

Reduction of the cross-sectional area of the lead makes a thermal resistance larger and therefore degrades a property for radiating heat generated from a semiconductor chip. This degrades the properties of the semiconductor chip. However, the reduction in the cross-sectional area is smaller and the thermal resistance is relatively smaller, as compared with a conventional method for providing an elongate through hole. Thus, the degree of degradation of the properties of the semiconductor chip caused by degradation of the heat radiation property is lower and is less of an obstacle in use.

In the above exemplary embodiments, the concave portion(s) 10 are provided on the surface of the lead that is opposite to the bending direction of the lead. Alternatively, the concave portion(s) 10 may be provided on a surface of the lead on the same side as the bending direction of the lead, or on both surfaces of the lead.

While there has been described what are considered to be exemplary embodiments of the invention, it will be understood that various modifications may be made thereto, and it is intended that the appended claims cover all such modifications as fall within the true spirit and scope of the invention.

What is claimed is:

1. A surface mount semiconductor device, comprising:
   a lead frame;
   a semiconductor chip located adjacent the lead frame;
   a package that is formed of a resin and has a concave portion and side faces, the concave portion including a transparent material therein that seals the semiconductor chip located at the concave portion, wherein the lead frame includes a lead extending laterally from one of the side faces of the package and includes a bending portion, the lead being bent at the bending portion of the lead such that the lead extends along the one of the side faces of the package, the lead having an extending direction that is substantially perpendicular to one of the side faces, a width direction that is substantially perpendicular to the extending direction and at least one of the side faces, and a thickness direction substantially perpendicular to both the extending direction and the width direction; and
   means for reducing a force required to bend the lead located at the bending portion of the lead, the means including a plurality of concave grooves formed at the bending portion of the lead on at least one surface of the lead, the concave grooves not penetrating through the lead in the thickness direction.

2. The surface mount semiconductor device according to claim 1, wherein
   the means for reducing the force required to bend the lead includes a concave elongate groove that does not penetrate through the lead in the thickness direction, is formed on at least one surface of the lead, and has one of an approximately V-shaped and an approximately U-shaped cross section when viewed from a direction substantially perpendicular to the extending and thickness directions of the lead.

3. The surface mount semiconductor device according to claim 1, wherein
   the means for reducing force required to bend the lead includes a plurality of concave grooves that do not penetrate through the lead in the thickness direction and are formed on at least one surface of the lead, each of the concave grooves having one of an approximately V-shaped and an approximately U-shaped cross section when viewed from a direction substantially perpendicular to the width and thickness directions of the lead.

4. A surface mount semiconductor device comprising:
   a lead frame having a top surface and a bottom surface;
   a package that is formed of a resin and has a concave portion and a first side face, the package located adjacent the lead frame;
   a semiconductor element located adjacent the concave portion and electrically connected with the lead frame; and
   a resin sealing portion which seals the semiconductor element with a transparent resin, wherein
   the bottom surface of the lead frame faces the first side face of the package,
   the lead frame has a portion extending laterally from the first side face of the package, the extending portion of the lead frame being bent such that it extends along the first side face of the package and forms a bent portion of the lead frame; and
   the bent portion of the lead frame includes a concave elongate groove that does not penetrate through the lead in a thickness direction, the elongate groove formed on the top surface of the lead frame, wherein the bent portion of the lead frame includes a plurality of elongate grooves.

5. The surface mount semiconductor device according to claim 4, wherein the bent portion of the lead frame is partially reduced in cross sectional thickness at its center.

6. The surface mount semiconductor device according to claim 4, wherein the bent portion of the lead frame includes at least one groove with a reduced cross-sectional thickness.

7. The surface mount semiconductor device according to claim 6, wherein a cross-sectional shape of the groove is one of substantially V-shaped and substantially U-shaped.

8. The surface mount semiconductor device according to claim 6, wherein the groove is elongate in a direction substantially perpendicular to a direction in which the lead extends.

9. The surface mount semiconductor device according to claim 6, wherein the groove is elongate in a direction substantially parallel to a direction in which the lead extends.

10. The surface mount semiconductor device according to claim 6, wherein the groove is an elongate groove provided in a direction substantially perpendicular to a direction in which the lead extends and which is shorter than a width of the lead.

11. The surface mount semiconductor device according to claim 4, wherein the bent portion of the lead frame includes a plurality of short grooves which extend substantially parallel to a direction in which the lead extends to reduce the cross-sectional thickness of the lead.

12. The surface mount semiconductor device according to claim 4, wherein the lead frame is insert-molded in the package and the semiconductor chip is mounted at a bottom portion of the concave portion.

13. The surface mount semiconductor device according to claim 1, wherein the lead frame is bent approximately perpendicularly at a portion that extends from the one of the side faces of the package.

14. The surface mount semiconductor device according to claim 4, further comprising: a second lead extending from a second side face of the package, the second side face being located opposite the first side face.

15. The surface mount semiconductor device according to claim 14, wherein the second lead includes a bent portion that has a reduced cross sectional thickness.

16. The surface mount semiconductor device according to claim 15, wherein the bent portion includes at least one groove that has one of a substantially U-shaped and substantially V-shaped cross-section.

17. The surface mount semiconductor device according to claim 4, wherein the lead frame is insert molded in the package.

* * * * *